(12) United States Patent  
Okumura et al.

(10) Patent No.: US 7,235,876 B2
(45) Date of Patent: Jun. 26, 2007

(54) SEMICONDUCTOR DEVICE HAVING METALLIC PLATE WITH GROOVE

(75) Inventors: Tomomi Okumura, Nukata-gun (JP); Yoshitsugu Sakamoto, Toyohashi (JP); Naohiko Hirano, Okazaki (JP); Kuniaki Mamitsu, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/516,501

(22) Filed: Sep. 7, 2006

(65) Prior Publication Data
US 2007/0057373 A1 Mar. 15, 2007

(30) Foreign Application Priority Data
Sep. 12, 2005 (JP) ............................ 2005-263635
Jun. 26, 2006 (JP) ............................ 2006-175050

(51) Int. Cl.
*H01L 23/10* (2006.01)
*H01L 23/34* (2006.01)

(52) U.S. Cl. ................ 257/706; 257/707; 257/712; 257/713; 257/717; 257/718; 257/719; 257/796; 257/E33.075; 257/E31.131; 257/E23.051; 257/E23.08; 257/E23.101

(58) Field of Classification Search ............ None
See application file for complete search history.

(56) References Cited

U.S. PATENT DOCUMENTS 4,994,897 A * 2/1991 Golubic et al. ............ 257/667
6,624,523 B2 * 9/2003 Chao et al. ................ 257/796
2004/0108602 A1 * 6/2004 Nakajima et al. .......... 257/787
2004/0188831 A1 * 9/2004 Hsiao ........................ 257/719
2005/0230816 A1 * 10/2005 Kurauchi et al. .......... 257/706

FOREIGN PATENT DOCUMENTS

| JP | 58-219754 | * 12/1983 | ............ 257/712 |
| JP | 60-65553 | * 4/1985 | ............ 257/718 |
| JP | 63-5537 | * 1/1988 | ............ 438/504 |
| JP | 1-115127 | * 5/1989 | ............ 257/622 |
| JP | U-H01-127275 | 8/1989 | |
| JP | U-H05-25756 | 4/1993 | |
| JP | 5-114678 | * 5/1993 | ............ 257/713 |
| JP | A-2004-303869 | 10/2004 | |
| JP | A-2004-335776 | 11/2004 | |
| JP | A-2005-123233 | 5/2005 | |

* cited by examiner

*Primary Examiner*—Jasmine Clark
(74) *Attorney, Agent, or Firm*—Posz Law Group, PLC

(57) ABSTRACT

A semiconductor device includes: first and second metallic plates, each of which includes a heat radiation surface and an inner surface; a semiconductor element between the metallic plates; a block between the second metallic plate and the semiconductor element; a solder member between the second metallic plate and the block; and a resin mold. The heat radiation surface is exposed from the resin mold. The second metallic plate includes a groove for preventing the solder member from expanding outside of the block. The groove is disposed on the inner surface and disposed on an outer periphery of the block. The second metallic plate further includes an inner surface member on an inner surface of the groove. The inner surface member has a solder wettability, which is larger than a solder wettability of the block.

8 Claims, 7 Drawing Sheets

FIG. 7
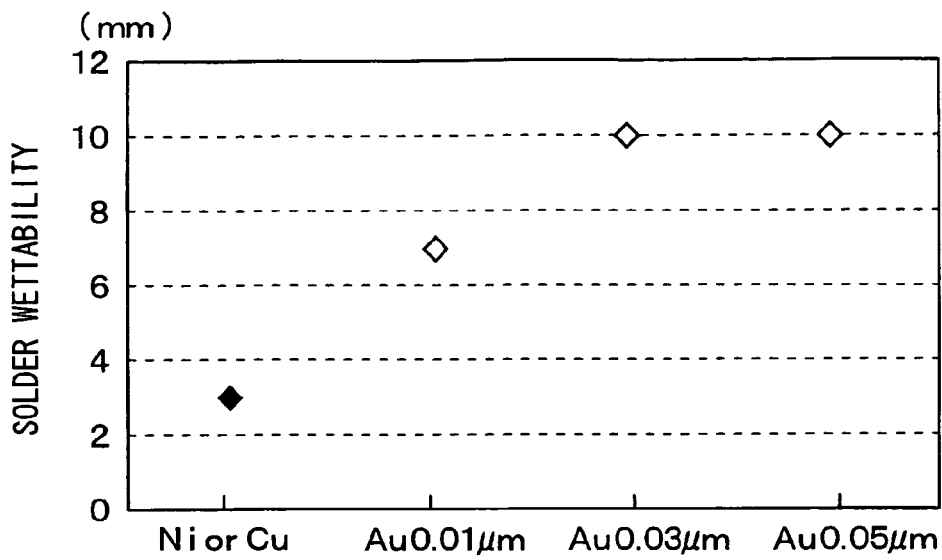
FIG. 8
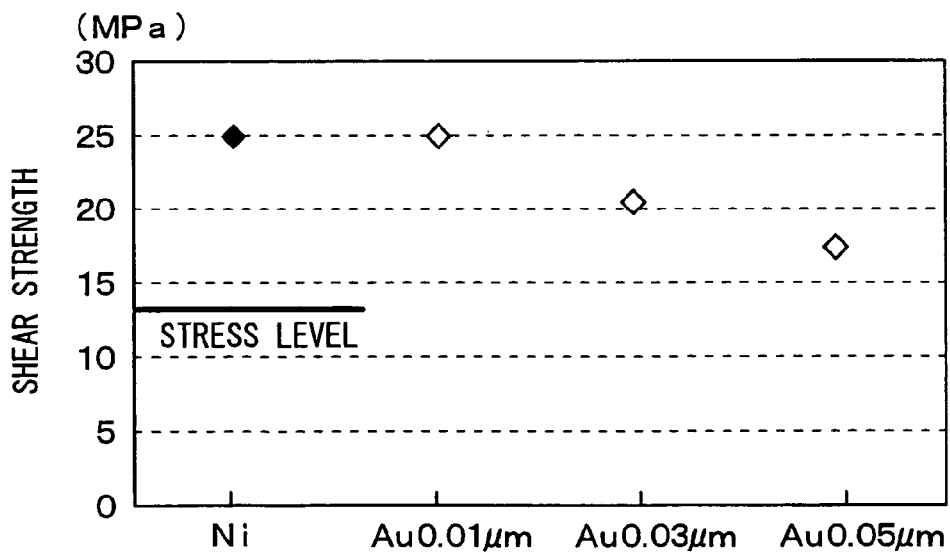
FIG. 9
| | W(mm) | | | |
|---|---|---|---|---|
| | | 0.5 | 1.0 | 1.5 | 2.0 |
| D(mm) | 0.1 | 1.5mm | 4.6mm | 3.8mm | 2.3mm |
| | 0.3 | ≧10mm | ≧10mm | 7.2mm | 4.4mm |
| | 0.5 | ≧10mm | 7.4mm | 4.4mm | 3mm |

SEMICONDUCTOR DEVICE HAVING METALLIC PLATE WITH GROOVE

CROSS REFERENCE TO RELATED APPLICATIONS

This application is based on Japanese Patent Applications No. 2005-263635 filed on Sep. 12, 2005, and No. 2006-175050 filed on Jun. 26, 2006, the disclosures of which are incorporated herein by reference.

FIELD OF THE INVENTION

The present invention relates to a semiconductor device having a metallic plate with a groove.

BACKGROUND OF THE INVENTION

A semiconductor device includes a metallic plate and a semiconductor element. The semiconductor element is bonded to the metallic plate with a solder so that a heat generated in the semiconductor element is radiated from the metallic plate. The device is disclosed in JP-2005-123233. The device further includes another metallic plate so that the semiconductor element is sandwiched between a pair of the metallic plates. A block is inserted between one of the metallic plates and the semiconductor element. The one of the metallic plates is bonded to the block with a solder. A pair of the metallic plates, the semiconductor element and the block are molded with a resin mold. A heat radiation surface of each metallic plate is exposed from the resin mold so that the metallic pate radiates heat generated in the semiconductor element. Accordingly, the heat in the semiconductor element is radiated from both sides of the element. Thus, the device provides a both-side heat radiation type semiconductor device.

The block between the metallic plate and the element is used for adjusting a clearance between the metallic plates in order to secure a space when multiple semiconductor elements are sandwiched between the metallic plates or when the semiconductor element is connected to a lead terminal with a wire.

In the device, one of the metallic plates, the semiconductor element, the block and the other one of the metallic plates are stacked together. In this case, the semiconductor element and the block are stacked on the one metallic plate in this order, and then the stacked plate, the element and the block are assembled. After that, an assembly turns over so that the block is disposed downward. Then, the assembly is mounted on the other metallic plate. Thus, the assembly with the metallic plate is bonded to the other one metallic plate with a solder.

At this time, a clearance between the metallic plates, i.e., a height of each element in the assembly in a stacking direction may be varied. To increase the tolerance of variation of the height of the element, a large amount of solder is inserted between the block and the metallic plate.

It is necessary to prevent the solder from spreading outside the block. Conventionally, a solder groove for preventing the solder from spreading is formed on a surface of a member, on which the solder is mounted. Specifically, the solder groove is disposed around a part of the member, the part on which an element is mounted with the solder. This is disclosed in, for example, JP-A-2004-335776.

However, in the both-side heat radiation type semiconductor device having the solder groove disposed around the solder, excess solder in the groove may spread through a side of the block, so that the excess solder reaches the semiconductor element. Thus, short-circuit in the element may be occurred.

Further, in another semiconductor device having a semiconductor element bonded to a metallic plate with a solder, excess solder in a solder groove of the device may cause short-circuit. Specifically, the solder is mounted on a part of the metallic plate so that the semiconductor element is bonded to the part of the metallic plate. The solder groove is formed around the part of the metallic plate. In this case, the excess solder in the groove may spread through a side of the semiconductor element, so that the excess solder reaches the surface of the semiconductor element, or the excess solder may overflow from the groove. Thus, the short-circuit is occurred.

SUMMARY OF THE INVENTION

In view of the above-described problem, it is an object of the present disclosure to provide a semiconductor device having a metallic plate with a groove.

According to a first aspect of the present disclosure, a semiconductor device includes: first and second metallic plates, each of which includes a heat radiation surface and an inner surface, wherein the inner surfaces of the metallic plates face each other; a semiconductor element disposed between the metallic plates; a block disposed between the second metallic plate and the semiconductor element; a solder member disposed between the second metallic plate and the block in order to connect therebetween; and a resin mold for molding the metallic plates, the semiconductor element and the block. The heat radiation surface of each metallic plate is exposed from the resin mold. The second metallic plate includes a groove for preventing the solder member from expanding outside the block. The groove is disposed on the inner surface of the second metallic plate, and disposed on an outer periphery of the block. The second metallic plate further includes an inner surface member on an inner surface of the groove. The inner surface member has a solder wettability, which is larger than a solder wettability of the block.

In the above device, the solder member is prevented from expanding outside the block. Thus, a short-circuit of the semiconductor element is not occurred in the device, so that the device shows excellent quality.

According to a second aspect of the present disclosure, a semiconductor device includes: a metallic plate; a semiconductor element disposed on the metallic plate; and a solder member disposed between the metallic plate and the semiconductor element in order to connect therebetween. The metallic plate includes a groove for preventing the solder member from expanding outside the semiconductor element. The groove is disposed on a side of the second metallic plate, the side on which the semiconductor element is disposed. The groove is disposed on an outer periphery of the semiconductor element. The metallic plate further includes an inner surface member disposed on an inner surface of the groove. The inner surface member has a solder wettability, which is larger than a solder wettability of the semiconductor element.

In the above device, the solder member is prevented from expanding outside the semiconductor element. Thus, a short-circuit of the semiconductor element is not occurred in the device, so that the device shows excellent quality.

BRIEF DESCRIPTION OF THE DRAWINGS

The above and other objects, features and advantages of the present invention will become more apparent from the following detailed description made with reference to the accompanying drawings. In the drawings:

FIG. 7 is a graph showing a relationship between a thickness of a film and solder wettability;

FIG. 8 is a graph showing a relationship between a thickness of the film and shear strength;

FIG. 9 is a table showing solder wettability in various grooves having different width and thickness;

DETAILED DESCRIPTION OF THE PREFERRED EMBODIMENTS

Figure 1:
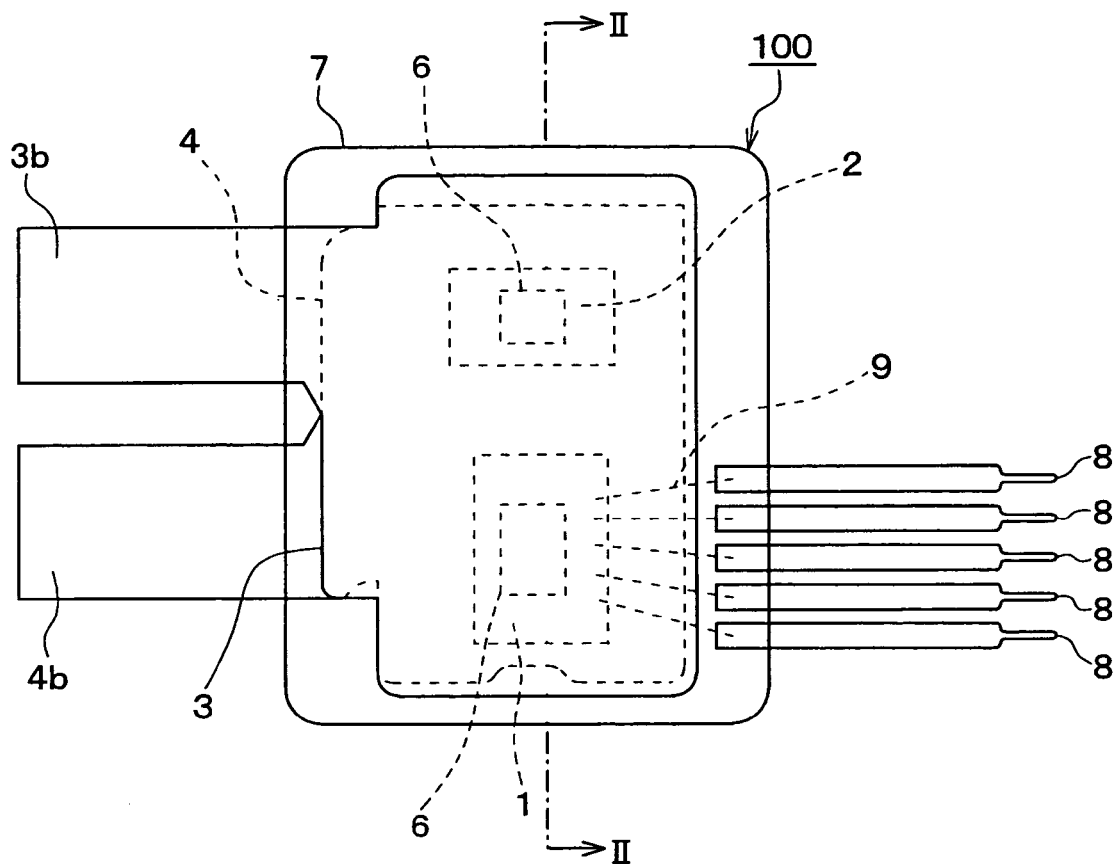
FIG. 1 is a plan view showing a semiconductor device.
Figure 2:
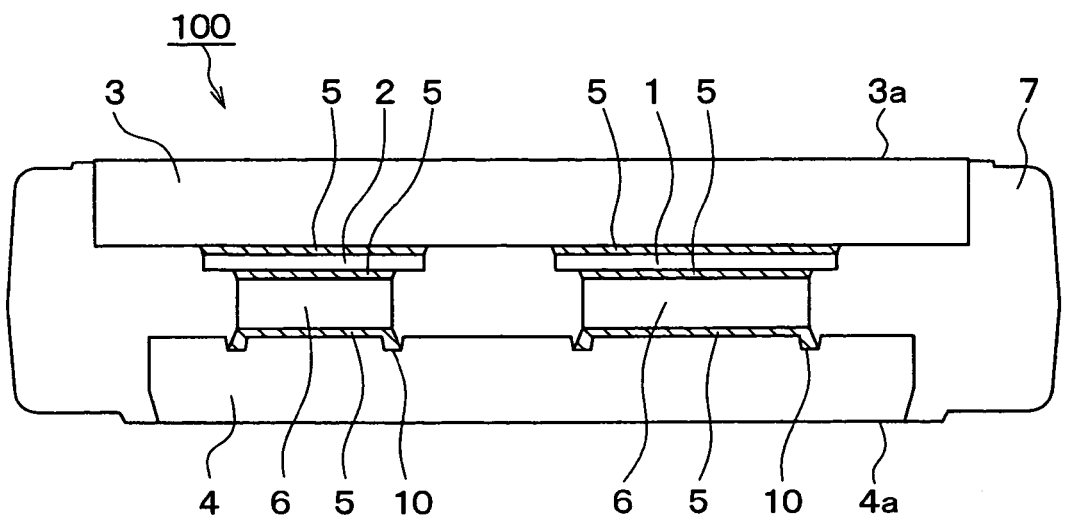
FIG. 2 is a cross sectional view showing the device taken along line II—II in FIG. 1.
Figure 3:
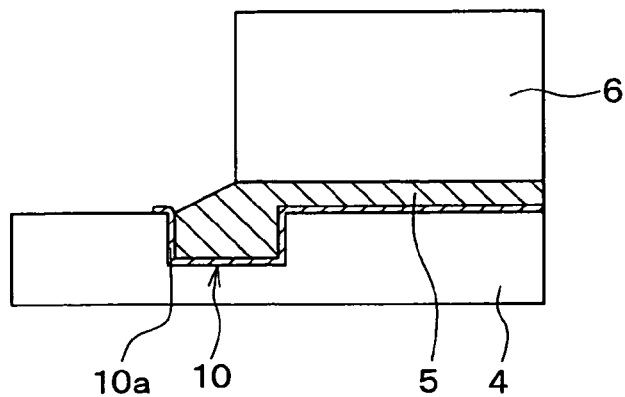
FIG. 3 is a partially enlarged cross sectional view showing a groove in the device.
Figure 4:
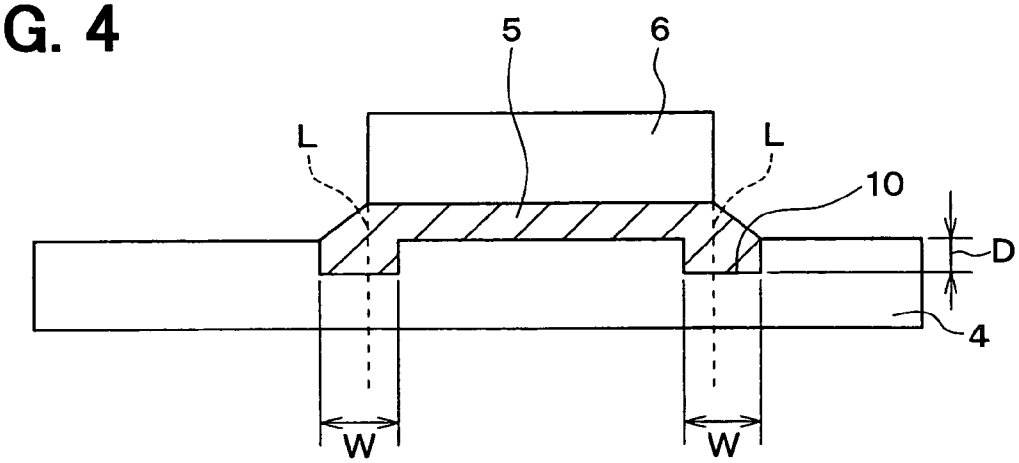
FIG. 4 is a partially enlarged cross sectional view showing a block in the device.

A semiconductor device 100 according to a first example embodiment is shown in FIGS. 1 to 4. In FIG. 1, each element in the device 100 is drawn through a resin mold 7. FIG. 4 shows a block 6 on a first semiconductor side. This device 100 is suitably used for an in-vehicle device mounted on an automotive vehicle so that the device 100 controls and drives electronic equipment in the vehicle.

The device 100 includes first and second semiconductor elements 1, 2, which are arranged on a certain plane of the device 100. In this embodiment, the first semiconductor element 1 is an IGBT (i.e., insulated gate bipolar transistor), and the second semiconductor element 2 is a FWD (i.e., free wheeling diode).

Both sides of each semiconductor element 1, 2 are covered with electrodes of the element 1, 2 and a pair of metallic plates 3, 4. Thus, both sides of the element 1, 2 are sandwiched between the metallic plates 3, 4. The metallic plates 3, 4 are made of conventional material such as lead frame material. Specifically, the metallic plates 3, 4 are made of copper alloy with a nickel coating.

A pair of the metallic plates 3, 4 are arranged to face each other so that the metallic plates 3, 4 sandwich the semiconductor elements 1, 2. As shown in FIG. 2, the metallic plate 3 disposed on an upper side provides a first metallic plate 3, and the other metallic plate 4 disposed on a lower side provides a second metallic plate 4. Each metallic plate 3, 4 includes an inner surface and an outer surface 3a, 4a. The outer surface 3a, 4a provides a heat radiation surface.

One side of the element 1, 2 is electrically and thermally connected to the inner surface of the first metallic plate 3 through a solder member 5. The block 6 is inserted between the other side of the element 1, 2 and the inner surface of the second metallic plate 4.

The block 6 has excellent electric conductivity and excellent heat conductivity. The block 6 has a rectangular shape. The block 6 is made of, for example, copper. Alternatively, the block 6 may be made of molybdenum. The solder member 5 connects between the semiconductor element 1, 2 and the block 6 electrically and thermally. Further, the solder member 5 connects between the block 6 and the second metallic plate 4 electrically and thermally.

The solder member 5 is made of conventional solder material, which is used for a semiconductor industry. For example, the solder member 5 is made of lead free solder such as tin-copper alloy solder.

In the device 100, the metallic plates 3, 4, the elements 1, 2 and the block 6 are molded with resin mold 7. The resin mold 7 is made of, for example, epoxy resin. Specifically, the resin mold 7 with the metallic plates 3, 4, the elements 1, 2 and the block 6 are formed by a die forming method.

The heat radiation surface 3a, 4a of each metallic plate 3, 4 is exposed from the resin mold 7. Thus, heat radiation is performed from both sides of each semiconductor element 1, 2 through the first and second metallic plates 3, 4. The device 100 provides a both-side heat radiation device.

A pair of the metallic plates 3, 4 is electrically connected to electrodes (not shown) of each semiconductor element 1, 2 through the solder member 5 and/or the block 6.

In the device 100, multiple terminals 3b, 4b are disposed. The terminals 3b, 4b are electrically connected to the semiconductor elements 1, 2. A part of each terminal 3b, 4b is exposed from the resin mold 7, and the other part of the terminal 3b, 4b is molded with the resin mold 7.

The first metallic plate 3 provides a collector side electrode of the IGBT as the first semiconductor element 1 and a cathode side electrode of the FWD as the second semiconductor element 2. The second metallic plate 4 provides an emitter side electrode of the IGBT and an anode side electrode of the FWD.

One of the terminals 3b provides a collector lead terminal 3b, which is formed integrally with the first metallic plate 3. The collector lead terminal 3b protrudes from one side of the first metallic plate 3 toward an outside of the resin mold 7. One of the terminals 4b provides an emitter lead terminal 4b, which is formed integrally with the second metallic plate 4. The emitter lead terminal 4b protrudes from one side of the second metallic plate 4 toward an outside of the resin mold 7.

A third terminal 8 made from a lead frame, which is a different member of the metallic plates 3, 4, provides a control terminal 8. The control terminal 8 is formed inside of the resin mold 7, and disposed around the IGBT 1.

The control terminal 8 is used for a gate terminal of the IGBT 1 and/or a testing terminal of various elements. The IGBT 1 is electrically connected to the control terminal 8 through a bonding wire 9.

The block 6 disposed between the second metallic plate 4 and the semiconductor elements 1, 2 secures a height between a wire bonding surface of the IGBT 1 and the second metallic plate 4 in order to maintain the height of the bonding wire 9 when the IGBT 1 is bonded to the control terminal 8 by a wire bonding method.

The solder member 5 is formed between the second metallic plate 4 and the block 6 so that they are electrically, mechanically and thermally connected each other. As shown in FIGS. 2 to 4, a solder groove 10 is formed on an inner surface of the second metallic plate 4. Specifically, the groove 10 is disposed on an outer periphery of a region of the second metallic plate 4, on which the solder member is to be formed. The groove 10 prevents the solder member 5 from expanding outside of the block 6.

Figure 5:
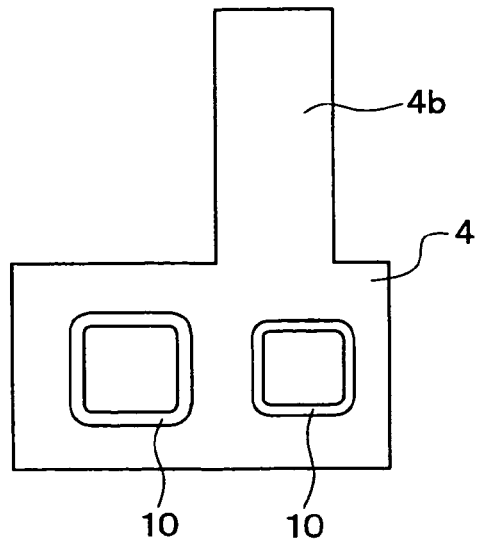
FIG. 5 is a plan view showing the groove on a second metallic plate in the device.

FIG. 5 shows the inner surface of the second metallic plate 4 and the solder groove 10. The second metallic plate 4 includes two solder grooves 10, each of which corresponds to the block 6. The device 100 includes two blocks 6, which correspond to two semiconductor elements 1, 2.

Each groove 10 has a ring shape, which is slight larger than the corresponding block 6. The ring shape of the groove 10 surrounds an outer periphery of the block 6 so that excess solder is accommodated in the groove 10.

The groove 10 has a rectangular ring shape, which corresponds to a rectangular planar shape of the block 6. The solder member 5 is firstly disposed inside of the groove 10. When the block 6 is reflowed to the second metallic plate 4 with the solder member 5, the groove 10 prevents the solder member 5 from expanding to the outside of the block 6.

In the device 100, the planar size of the first semiconductor element 1 is different from that of the second semiconductor element 2. Therefore, one of the grooves 10 has a planar shape, which is different from that of the other one of the grooves 10. In the device 100, the groove 10 corresponding to the block 6 on the IGBT side is larger than that on the FWD side.

The groove 10 has a rectangular cross section, as shown in FIGS. 3 and 4. An edge of each block 6 is located over the groove 10. Specifically, the edge of the block 6 is disposed in a range of a width of the groove 10. Thus, a positioning relationship between the block 6 and the groove 10 is appropriately determined.

In FIG. 4, the range of the width of the groove 10 is shown as W, and the edge of the block 6 is shown as L. The edge L is disposed in the range W.

The inner surface of the groove 10 has solder wettability, which is larger than that of the edge of the block 6. Specifically, an inner surface member 10a is formed on the inner surface of the groove 10. The solder wettability of the inner surface member 10a is larger than that of the edge of the block 6.

The inner surface member 10a is a thin film made of material such as gold, silver or tin. The inner surface member 10a is formed by a coating method, a vapor deposition method or the like. Here, the block 6 is made of copper, molybdenum or the like. In the device 100, the inner surface member 10a is formed of a gold film by a gold coating method.

The groove 10 is formed on the surfaced of the second metallic plate 4 by a press working method. Then, the gold film 10a is formed on the inner surface of the groove 10. The gold film 10a may be formed by a conventional electroplating method, an electroless plating method, or the like.

The gold film 10a is formed on at least the inner surface of the groove 10.

Alternatively, the gold film 10a may be formed not only on the inner surface of the groove 10 but also on the inside surface of the second metallic plate 4, which is disposed inside of the groove 10. Further, alternatively, the gold film 10a may be formed on whole surface of the second metallic plate 4.

Figure 6A:
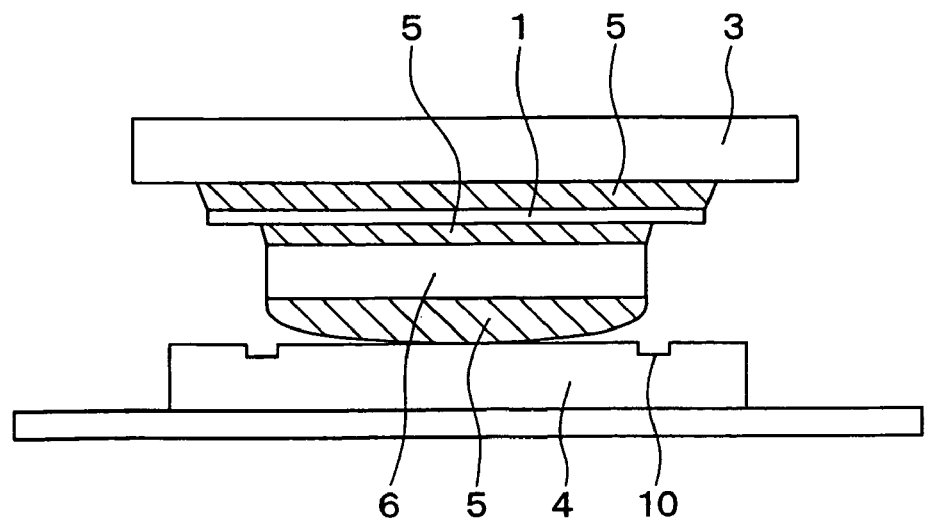
FIGS. 6A and 6B are schematic cross sectional views explaining a method of manufacturing the device.
Figure 6B:
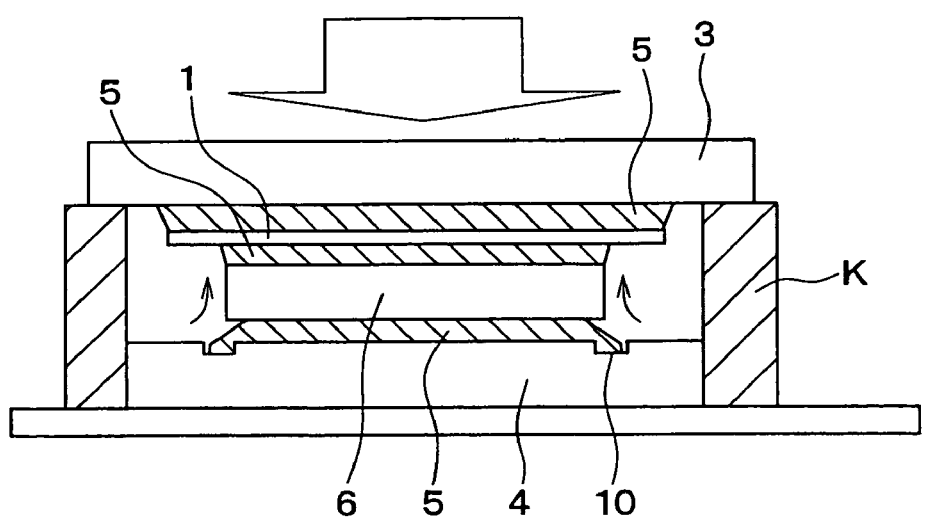

A method for manufacturing the device 100 is shown in FIGS. 6A and 6B. First, the semiconductor element 1, 2 is mounted on the inner surface of the first metallic plate 3 through a solder foil. Then, the block 6 is formed on the semiconductor element 1, 2 through another solder foil.

Each element 1, 2, 3, 6 is stacked with the solder foil, and each element 1, 2, 3, 6 are reflowed so that the elements 1, 2, 3, 6 are soldered with the solder member 5. Then, a lead frame as the control terminal 8 is connected to the IGBT 1 with the bonding wire 9.

The above wire bonding step may be performed after the IGBT 1 is soldered to the first metallic plate 3 and before the block 6 is stacked on the semiconductor element 1, 2. After that, the block 6 is stacked on the semiconductor element 1, 2. Thus, an assembly of the first metallic plate 3, the semiconductor elements 1, 2 and the block 6 are formed, the assembly in which the control terminal 8 is connected to the element 1.

The solder foil having a large amount is formed on the block 6 in the assembly, and then, the block 6 is turned down. Thus, the block 6 in the assembly is mounted on the second metallic plate 4 through the solder foil. Specifically, the block 6 is mounted on the inner surface of the second metallic plate 4, on which the groove 10 is formed. Alternatively, the solder foil may be formed on the inner surface of the second metallic plate 4.

In the above method, a large amount of solder foil is formed on the block 6. This is because the tolerance of variation of the height of the semiconductor element 1, 2 is increased. Here, to form a large amount of the solder foil on the semiconductor element 1, 2 for increasing the tolerance of variation of the height of the semiconductor element 1, 2 is not appropriate, since excess solder may penetrate onto a surface of the semiconductor element 1, 2.

After the assembly is mounted on the second metallic plate 4 through the solder foil, the block 6 is reflowed to the second metallic plate 4 with the solder member 5. Further, the assembly is pressed to the second metallic plate 4 so that the semiconductor element 1, 2 is arranged to have an appropriate height between the metallic plates 3, 4. In this case, for example, a jig K for adjusting the height, i.e., the clearance between the first and second metallic plates 3, 4, may be used.

Since a large amount of the solder foil is supplied between the block 6 and the second metallic plate 4, the solder member 5 is sufficiently supplied for bonding between the block 6 and the second metallic plate 4 even if the height, i.e., the thickness of each element between the metallic plates 3, 4 is smaller than a designing thickness. Thus, the solder member 5 bonds among the elements 1, 2, 3, 4, 6 without running short.

Further, since the edge L of the block 6 is disposed above the groove 10, the solder member 5 disposed under the edge L of the block 6 is pushed out from the block 6 toward the groove 10 when the assembly is pressed on the second metallic plate 4. Thus, excess solder is accommodated in the groove 10 easily.

Thus, the device 100 is completed. In a prior art, when the assembly is reflowed with the solder member 5, the excess solder in the groove 10 may expand on the edge L of the block 6 so that the excess solder reaches the semiconductor element 1, 2 and the element 1, 2 may short-circuit. However, since the inner surface member 1a is formed on the inner surface of the groove 10, the excess solder does not expand on the edge L of the block 6.

The gold film as the inner surface member 10a has a thickness in a range between 0.01 μm and 0.03 μm. This is determined based on the following reasons.

FIG. 7 is a graph showing solder wettability of various gold films 10a having different thickness. FIG. 8 shows shear strength of various gold films 10a. The shear strength is defined between the gold film 10a and the resin mold 7. Here, the shear strength shows adhesiveness between the gold film 10a and the resin mold 7.

The reason why the adhesiveness between the gold film 10a and the resin mold 7 is investigated is explained as follows. For example, when the device 100 is mounted on a part of equipment, the solder groove 10 may have space without filling the groove 10 with the excess solder.

Further, when the gold film 10a is selectively formed on a part of the groove 10, the gold film 10a may be formed on another part of the second metallic plate 4 other than the part of the groove 10. Specifically, the gold film 10a may be formed on an outer periphery of the groove 10 because of manufacturing error. Thus, the gold film 10a may contact the resin mold 7. Therefore, the adhesiveness between the gold film 10a and the resin mold 7 is studied.

The above solder wettability measurement is performed by using lead-free solder such as tin-copper series solder and by a solder ball test, which is a conventional solder wettability test.

The solder ball test is such that a solder ball having predetermined dimensions is arranged on the gold film 10a, which is formed on the second metallic plate 4. Then, the solder ball is reflowed and expanded on the second metallic plate 4. Thus, the diameter of the solder ball is detected. When the diameter of the solder ball is large, the solder wettability of the solder ball is large, and the solder ball is easily expanded.

In FIG. 7, "Ni or Cu" represents a case where the second metallic plate 4 is bonded to the block 6 directly without forming the gold film 10a. Specifically, the surface of the second metallic plate 4 is formed of a Ni coating, and the block 6 is made of copper. In these cases, the solder wettability of copper or nickel is 3 mm.

The thickness of the gold film 10a is changed in a range between 0.01 µm and 0.03 µm. The solder wettability of the gold film 10a having the thickness in a range between 0.01 µm and 0.03 µm has large wettability larger than that of the block 6, i.e., the case of "Cu" in FIG. 7.

As the thickness of the gold film 10a becomes larger, the solder wettability becomes larger. The wettability of the gold having the thickness of 0.05 µm is almost the same as the wettability of the gold film 10a having the thickness of 0.03 µm. Thus, the solder wettability is saturated.

The adhesiveness between the resin mold 7 and the gold film 10a is measured such that the shear strength of the resin mold 7 molding the gold film 10a is measured. In FIG. 8, "Ni" represents a case where the second metallic plate 4 without the gold film 10a is molded with the resin mold 7. The stress level shows a threshold that the resin mold 7 is removed from the gold film 10a when the shear strength is equal to or smaller than the threshold.

When the thickness of the gold film 10a is changed in a range between 0.01 µm and 0.05 µm, the shear strength, i.e., the adhesiveness of the resin mold 7 on the gold film 10a is larger than the threshold (i.e., the stress level).

Thus, when the thickness of the gold film 10a is equal to or larger than 0.01 µm, the solder wettability of the gold film 10a is larger than that of the edge of the block 6. When the thickness of the gold film 10a is 0.05 µm, the solder wettability of the gold film 10a is saturated. When the thickness of the gold film 10a is 0.05 µm, the shear strength of the gold film 10a reaches the threshold so that margin of the shear strength against the threshold is comparatively small. Further, as the thickness of the gold film 10a becomes larger, a manufacturing cost of the gold film 10a becomes large. In view of these points, the thickness of the gold film 10a is set to be in a range between 0.01 µm and 0.03 µm.

Thus, when the thickness of the gold film 10a is changed, the solder wettability of the gold film 10a and the shear strength of the gold film 10a are also changed. Although these mechanisms are not clear, the thickness of the gold film 10a can be determined.

FIG. 9 is solder wettability of a Ni coating surface of the second metallic plate 4 without forming the gold film 10a in the groove 10 having various width W and various depth D. Specifically, the solder ball test is performed on the Ni coating surface, and the solder ball having predetermined dimensions is used. The dimensions of the solder ball are determined in such a manner that the solder ball is just accommodated in the groove 10.

The width W of the groove 10 is changed from 0.5 mm to 2.0 mm. The depth D of the solder groove 10 is also change from 0.1 mm to 0.5 mm.

When the width W of the groove 10 is equal to or smaller than 1.5 mm, and when the depth of the groove 10 is equal to or larger than 0.3 mm, the solder wettability becomes comparatively large. Although the mechanism is not clear, the width W and the depth D of the groove 10 can be determined.

Figure 10:
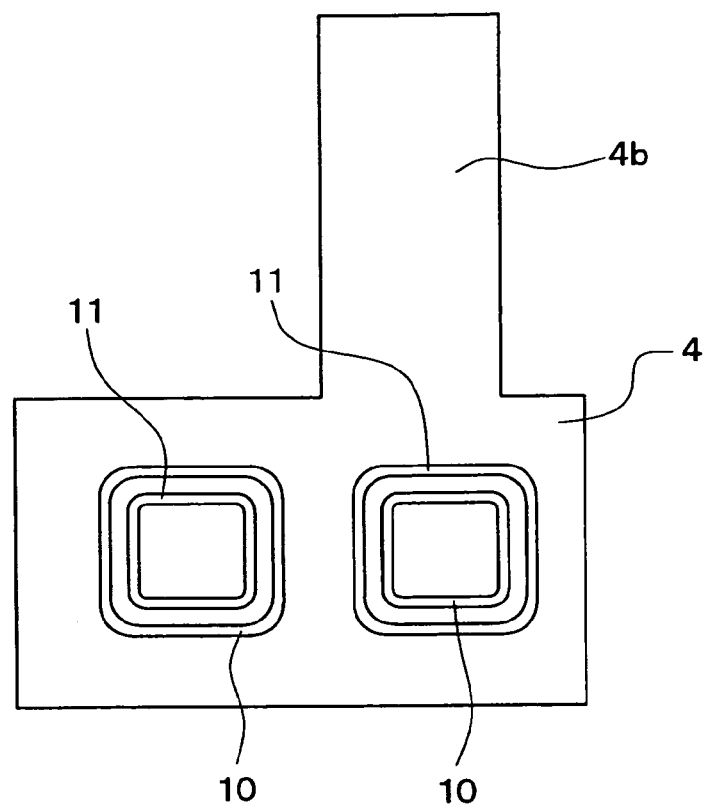
FIG. 10 is a plan view showing a groove on a second metallic plate in another semiconductor device.

A first solder groove 10 with a second groove 11 according to a second example embodiment is shown in FIG. 10.

In FIG. 5, the second metallic plate 4 has two grooves 10, which correspond to the blocks 6 in accordance with the first and second semiconductor elements 1, 2. The dimensions of one groove 10 are different from those of the other groove 10.

The groove 10 is formed on the metallic plate 4 by a press working method. In this case, a periphery of the groove 10 may be deformed.

When multiple grooves 10 are formed on the metallic plate 4, and when each groove 10 has different planar shape, deformation of the metallic plate 4 around each groove 10 may be different. Thus, the deformation of the metallic plate 4 is partially different, so that the deviation from flatness of the metallic plate 4 is increased. When the deviation from flatness is large, a degree of parallelism between the metallic plates 3, 4 may be reduced.

To maintain or to reduce the deviation from flatness of the metallic plate 4, a dummy groove 11 as the second groove 11 is formed on the inner surface of the second metallic plate 4. The dummy groove 11 is also formed by the press working method. The dummy groove 11 functions to reduce the deformation of the second metallic plate 4. Thus, the deviation from flatness of the metallic plate 4 is improved.

In FIG. 10, the metallic plate 4 includes two dummy grooves 11, each of which corresponds to the groove 10, respectively. Specifically, when the block 6 corresponding to the first semiconductor element 1 is large, and the groove 10 corresponding to the large block 6 is large, the dummy groove 11 is formed inside of the groove 10 so that the groove 10 and the dummy groove 11 provide a pair. In this case, the dummy groove 11 has the same dimensions as the groove 10 corresponding to the second semiconductor element 2. The groove 10 corresponding to the first semiconductor element 1 has the same dimensions as the dummy groove 11 corresponding to the second semiconductor element 2. Thus, one pair of the groove 10 and the dummy groove 11 corresponding to the first semiconductor element 1 has the same planar shape as the other pair of the groove 10 and the dummy groove 11 corresponding to the second semiconductor element 2.

More specifically, the large groove 10 is disposed on the IGBT side, and the large groove 10 is disposed on the FWD side. The small dummy groove 11 disposed on the IGBT side is formed inside of the large groove 10. The dimensions of the small dummy groove 11 are substantially the same as the small groove 10 disposed on the FWD side. The large dummy groove 11 disposed on the FWD side is formed outside of the small groove 10. The dimensions of the large dummy groove 11 are substantially the same as the large groove 10 disposed on the IGBT side.

Thus, the IGBT side pair of the groove 10 and the dummy groove 11 has the same planar shape as the FWD side pair.

Accordingly, the partial deformation difference of the second metallic plate 4 between different grooves 10 is reduced, so that the deviation from flatness of the metallic plate 4 is improved.

Figure 11:
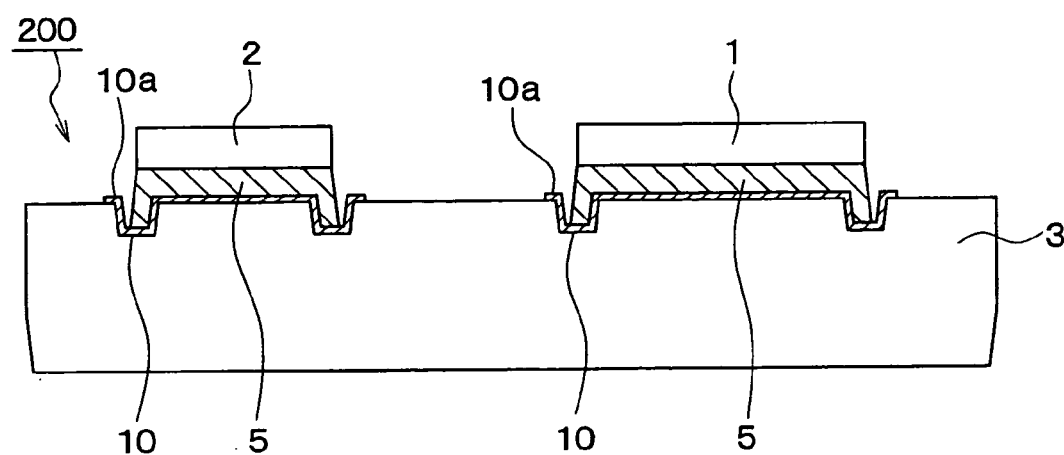
FIG. 11 is a cross sectional view showing further another semiconductor device.

A semiconductor device 200 according to a third example embodiment is shown in FIG. 11. The device 200 is a one-side heat radiation device.

The device 200 includes the first metallic plate 3 and the semiconductor elements 1, 2, which are mounted on the first metallic plate 3 through the solder member 5. Alternatively, the device may have multiple semiconductor elements. Each element 1, 2 is electrically connected to another part with a bonding wire or the like.

The heat generated in the element 1, 2 is radiated from the metallic plate 3 through the solder member 5. The groove 10 having the ring shape is formed on a part of the metallic plate 3, the part which is disposed outside of the solder member 5. The groove 10 prevents the solder member 5 from expanding outside of the element 1, 2. The groove 10 includes an inner surface member 10a, solder wettability of which is larger than that of the edge of the element 1, 2. The inner surface member 10a is made of a gold film.

Thus, the inner surface member 10a prevents the solder member from expanding on the edge of the semiconductor element 1, 2.

In the device 200, the thickness of the inner surface member 10a is in a range between 0.01 μm and 0.1 μm. This is determined in view of the following reasons.

The solder wettability is performed on the semiconductor element 1, 2 by the solder ball test. Here, a solder expanding area is measure as the solder wettability. A solder bonding strength is studied by a tensile strength test.

Figure 12:
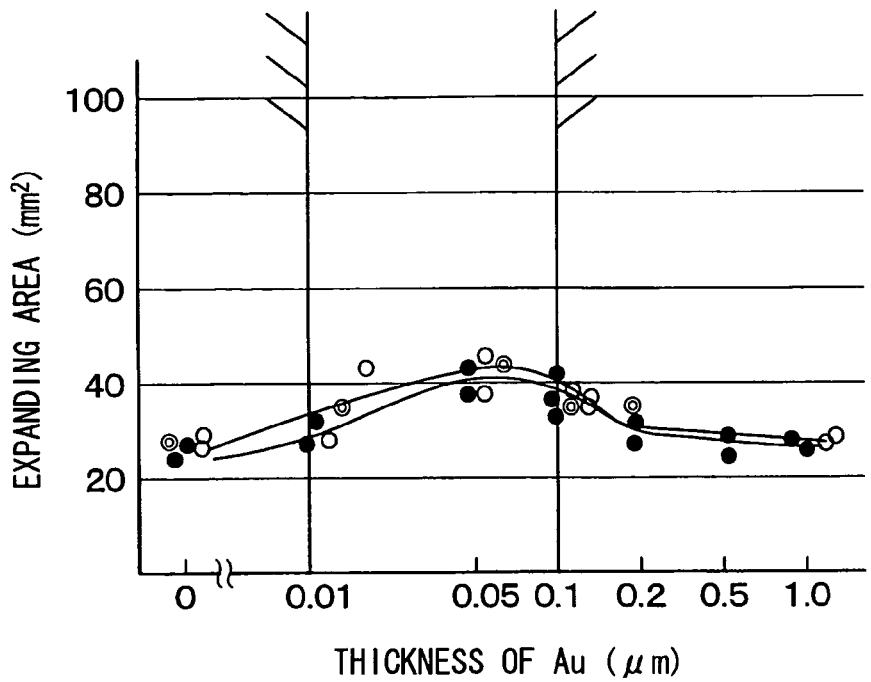
FIG. 12 is a graph showing a relationship between solder expanding area and a thickness of a film.
Figure 13:
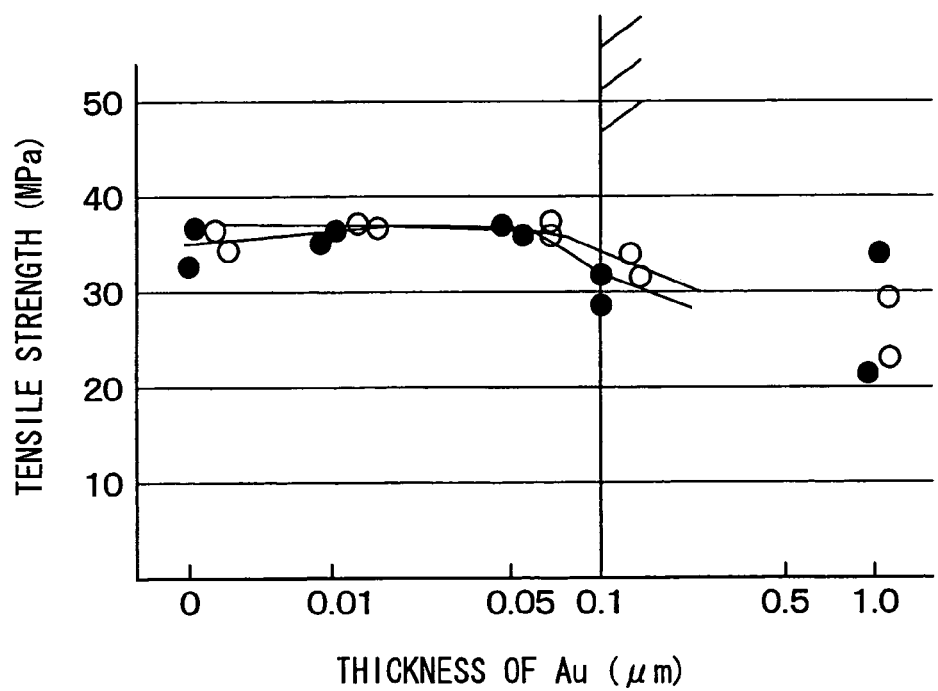
FIG. 13 is a graph showing a relationship between tensile strength and a thickness of the film.

FIG. 12 shows the solder expanding area, i.e., the wettability of the gold film 10a having various thicknesses. FIG. 13 shows the tensile strength of the solder member 5 on the gold film 10a having various thicknesses. In FIGS. 12 and 13, an approximate curve is shown, and a dot shows an experimental result.

As shown in FIG. 12, when the thickness of the gold film 10a is in a range between 0.01 μm and 1.0 μm, the wettability is comparatively large, compared with other thicknesses. As shown in FIG. 13, when the thickness of the gold film 10a is larger than 1.0 μm, the solder bonding strength is rapidly reduced. Thus, it is preferred that the thickness of the gold film 10a is in a range between 0.01 μm and 1.0 μm.

Although the solder groove 10 has the rectangular cross section, the groove 10 may have a V-shaped cross section or a U-shaped cross section. Further solder groove 10 may have another shape or other dimensions other than the groove shown in FIGS. 1–13.

For example, although the groove 10 has the rectangular ring shape, the groove 10 may have another planar shape corresponding to the planar shape of the block 6 and/or the planar shape of the semiconductor element 1, 2.

Figure 14A:
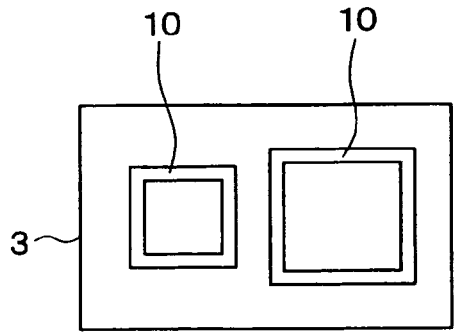
FIGS. 14A to 14C are plan views showing various grooves in a semiconductor device.
Figure 14B:
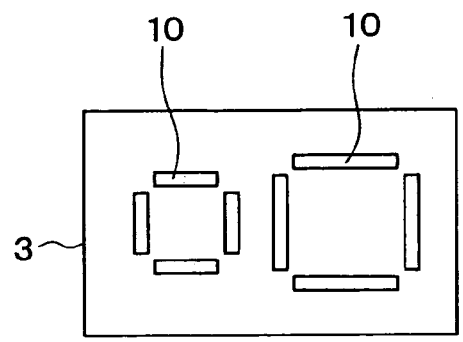
Figure 14C:
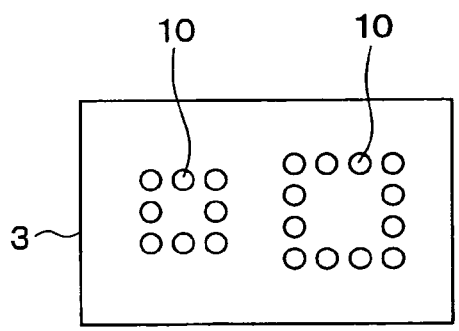
Figure 15A:
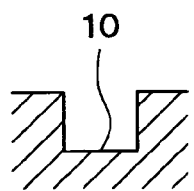
FIGS. 15A to 15F are cross sectional views showing various grooves in a semiconductor device.
Figure 15B:
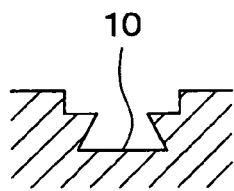
Figure 15C:
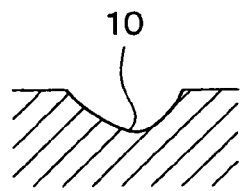
Figure 15D:
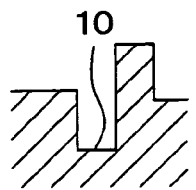
Figure 15E:
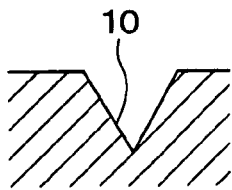
Figure 15F:
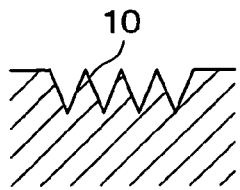

FIGS. 14A to 14C show various planar shapes of the groove 10. In FIGS. 14B and 14C, the groove 10 has a discontinuous ring shape. FIGS. 15A to 15F show various cross sections of the groove 10. These grooves 10 can be formed by the press working method.

Although the solder foil is mounted on the block 6 so that the block 6 is ref lowed on the second metallic plate 4, the block 6 may be disposed between the first metallic plate 3 and the semiconductor elements 1, 2 so that the block 6 is reflowed on the first metallic plate 3. In this case, the solder groove 10 is formed on the first metallic plate 3.

In the both-side heat radiation type device, the groove 10 is formed on the second metallic plate 4. Alternatively, the groove 10 may be formed not only on the second metallic plate 4 but also on the first metallic plate 3, on which the semiconductor elements 1, 2 are soldered. In this case, the inner surface member 10a may be formed on whole surface of each of the first and second metallic plates 3, 4.

The exposing position of the collector lead terminal 3b, the emitter lead terminal 4b or the control terminal 8 from the resin mold 7 is not limited to the above example embodiments.

In the both-side heat radiation device, the semiconductor elements 1, 2 sandwiched between the metallic plates 3, 4 may be other element other than the IGBT and the FWD as long as the metallic plates 3, 4 are used for the electrodes of the element. Although the device 100, 200 includes two semiconductor elements 1, 2, the device may include only one semiconductor element or multiple semiconductor elements.

When the device 100, 200 includes three or more semiconductor elements, the device 100, 200 also includes multiple blocks 6 and multiple solder grooves 10, which correspond to the semiconductor elements. Further, multiple dummy grooves may be formed on each groove 10.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   first and second metallic plates, each of which includes a heat radiation surface and an inner surface, wherein the inner surfaces of the metallic plates face each other;
   a semiconductor element disposed between the metallic plates;
   a block disposed between the second metallic plate and the semiconductor element;
   a solder member disposed between the second metallic plate and the block in order to connect therebetween; and
   a resin mold for molding the metallic plates, the semiconductor element and the block, wherein
   the heat radiation surface of each metallic plate is exposed from the resin mold,
   the second metallic plate includes a groove for preventing the solder member from expanding outside the block,
   the groove is disposed on the inner surface of the second metallic plate, and disposed on an outer periphery of the block,
   the second metallic plate further includes an inner surface member on an inner surface of the grove, and
   the inner surface member has a solder wettability, which is larger than a solder wettability of the block.

2. The device according to claim 1, wherein
   the inner surface member is made of a gold film.

3. The device according to claim 2, wherein the inner surface member has a thickness in a range between 0.01 μm and 0.03 μm.

4. The device according to claim 1, wherein the block has an edge, which is disposed above the groove.

5. The device according to claim 1, wherein
the semiconductor element includes a plurality of semiconductor parts,
the block includes a plurality of block parts, which correspond to the semiconductor parts,
the second metallic plate includes a plurality of grooves, which correspond to the block parts,
each groove has a different planar shape corresponding to a planar shape of the block, and
the second metallic plate further includes a plurality of dummy grooves for reducing a deviation from flatness of the second metallic plate.

6. The device according to claim 5, wherein
each groove and corresponding dummy grooves provide a pair,
the groove and the corresponding dummy grooves are disposed on a region of the metallic plate, the region on which the corresponding block is disposed through the solder member, and
each pair has a common planar shape composing the groove and the corresponding dummy grooves so that a plurality of pairs corresponding to the grooves have the same common planar shape.

7. A semiconductor device comprising:
a metallic plate;
a semiconductor element disposed on the metallic plate; and
a solder member disposed between the metallic plate and the semiconductor element in order to connect therebetween, wherein
the metallic plate includes a groove for preventing the solder member from expanding outside the semiconductor element,
the groove is disposed on a side of the metallic plate, the side on which the semiconductor element is disposed,
the groove is disposed on an outer periphery of the semiconductor element,
the metallic plate further includes an inner surface member disposed on an inner surface of the groove, and
the inner surface member has a solder wettability, which is larger than a solder wettability of the semiconductor element.

8. The device according to claim 7, wherein
the inner surface member is made of a gold film, and
the inner surface member has a thickness in a range between 0.01 μm and 0.1 μm.

* * * * *